(12) United States Patent
Wang et al.

(10) Patent No.: US 7,042,767 B2
(45) Date of Patent: May 9, 2006

(54) FLASH MEMORY UNIT AND METHOD OF PROGRAMMING A FLASH MEMORY DEVICE

(75) Inventors: Zhigang Wang, Sunnyvale, CA (US); Nian Yang, Mountain View, CA (US); Zhizheng Liu, Sunnyvale, CA (US)

(73) Assignee: Spansion, LLC, Sunnyvale, CA (US)

( * ) Notice: Subject to any disclaimer, the term of this patent is extended or adjusted under 35 U.S.C. 154(b) by 0 days.

(21) Appl. No.: 10/909,693

(22) Filed: Aug. 2, 2004

(65) Prior Publication Data

US 2006/0023511 A1 Feb. 2, 2006

(51) Int. Cl.
*G11C 16/04* (2006.01)

(52) U.S. Cl. .............................. 365/185.28; 365/189.09
(58) Field of Classification Search ............ 365/185.28
See application file for complete search history.

(56) References Cited

U.S. PATENT DOCUMENTS

| | | | |
|---|---|---|---|
| 5,204,835 A | 4/1993 | Eitan | |
| 5,464,999 A | 11/1995 | Bergemont | |
| 5,717,634 A | 2/1998 | Smayling et al. | |
| 5,875,130 A * | 2/1999 | Haddad et al. | 365/185.33 |
| 5,901,090 A * | 5/1999 | Haddad et al. | 365/185.29 |
| 6,009,017 A | 12/1999 | Guo et al. | |
| 6,215,702 B1 | 4/2001 | Derhacobian et al. | |
| 6,246,611 B1 | 6/2001 | Pawletko et al. | |
| 6,275,415 B1 * | 8/2001 | Haddad et al. | 365/185.11 |
| 6,295,228 B1 | 9/2001 | Pawletko et al. | |
| 6,307,784 B1 | 10/2001 | Hamilton et al. | |
| 6,309,926 B1 | 10/2001 | Bell et al. | |
| 6,331,951 B1 | 12/2001 | Bautista, Jr. et al. | |
| 6,344,994 B1 | 2/2002 | Hamilton et al. | |
| 6,356,482 B1 | 3/2002 | Derhacobian et al. | |
| 6,370,061 B1 | 4/2002 | Yachareni et al. | |
| 6,400,624 B1 | 6/2002 | Parker et al. | |
| 6,442,074 B1 | 8/2002 | Hamilton et al. | |
| 6,456,533 B1 | 9/2002 | Hamilton et al. | |
| 6,510,085 B1 * | 1/2003 | Fastow et al. | 365/185.28 |
| 6,522,585 B1 | 2/2003 | Pasternak | |

\* cited by examiner

*Primary Examiner*—Thong Q. Le
(74) *Attorney, Agent, or Firm*—Renner, Otto, Boisselle & Sklar, LLP

(57) ABSTRACT

Disclosed are a flash memory unit and a method of programming a flash memory device. The method of programming can include applying respective programming voltages to a control gate and a drain of the memory device. A source bias potential can be applied to a source of the memory device. The application of the source bias potential can be controlled with the selective application of one of the programming voltages to a source bias switching device.

9 Claims, 2 Drawing Sheets

FLASH MEMORY UNIT AND METHOD OF PROGRAMMING A FLASH MEMORY DEVICE

TECHNICAL FIELD

The present invention relates generally to the field of non-volatile memory devices and, more particularly, to a method of programming memory devices of the flash memory unit using a source junction bias to enhance programming control.

BACKGROUND

A pervasive trend in modern integrated circuit manufacture is to increase the amount of data stored per unit area on an integrated circuit memory unit, such as a flash memory unit. That is, as flash memory technology progresses, the speed and memory density becomes higher and higher. Modern flash memory units are characterized by the non-volatility of the charge stored in the arrays of memory cells that make up the memory unit.

Memory units often include a relatively large number of core memory devices (sometimes referred to as core memory cells). These core memory devices can comprise a floating gate device where a conductive charge storing region (or floating gate) is located between a conductive wordline and a channel region of a substrate. The channel region is laterally disposed between a pair of bitlines. The floating gate can be separated from the wordline and the channel region by respective dielectric layers. In an alternative arrangement, the floating gate can be replaced by a non-conductive charge storing layer that can store data in plural charge storing regions. For example, a normal bit can be stored using a charge storing region adjacent a first bitline associated with the memory device and a complimentary bit can be stored using a charge storing region adjacent a second bitline associated with the memory device.

Programming of the foregoing memory devices can be accomplished, for example, by hot electron injection. Hot electron injection involves "pulsing" the device by applying appropriate voltage potentials to each of the wordline (the wordline connected to or defining a control gate of the memory device) and a drain of the memory device for a specified duration. During the programming pulse, a bias potential can be applied to the source to assist in controlling the amount of charge injected into the memory device.

In addition to increasing the data storage density of flash memory units, there has been a trend toward low power applications. For instance, some applications provide operating voltage (Vcc) as small as 1.8 volts. In these applications, control logic associated with the core memory array may not behave as desired. For instance, in low power applications, a pass transistor that couples the source bias potential (e.g., about 0.8 volts) to the source of the memory device(s) being programmed may be driven with a voltage that does not fully turn on the pass transistor. As a result, the potential at the source junction of the memory device(s) being programmed can rise, thereby lowering a voltage difference between the drain and the source of the memory device being programmed. This condition leads to slower programming of the memory device and potential failure of automatic program disturb (APD). APD, which is also referred to as automatic program disturb after erase (APDE), is a process that corrects for such over-erased flash memory cells. During an APD process, sufficient charge carriers (e.g., electrons) are reinjected into the charge storing layer after an erase process to restore the threshold voltage of the over-erased flash memory cells.

Accordingly, there is a demand for a flash memory unit and method of programming that is capable of applying a desired source side bias during programming in low power applications.

SUMMARY OF THE INVENTION

According to one aspect of the invention, the invention is directed to a method of programming a flash memory device from a memory unit. The method can include applying a programming gate voltage to a control gate of the memory device; applying a programming drain voltage to a drain of the memory device; and coupling a source bias potential to a source of the memory device with a pass transistor controlled with a control signal having a voltage greater than an operational voltage available to the memory unit from an external power source.

According to another aspect of the invention, the invention is directed to a method of programming a flash memory device from a memory unit. The method can include applying respective programming voltages to a control gate and a drain of the memory device; and applying a source bias potential to a source of the memory device, wherein application of the source bias potential is controlled with the selective application of one of the programming voltages to a source bias switching device.

According to yet another aspect of the invention, the invention is directed to a flash memory unit having a plurality of flash memory devices arranged in a sector. The memory unit can include a plurality of wordlines arranged with respect to a plurality of bitlines and a charge storing layer to operatively form the memory devices; a pass transistor selectively operable in response to a control signal to couple a source bias voltage to a common source junction node defined by bitlines connected to function as source conductive regions for the memory devices during programming; and a control circuit for selectively applying one of a programming gate voltage or a programming drain voltage to the pass transistor as the control signal.

BRIEF DESCRIPTION OF DRAWINGS

These and further features of the present invention will be apparent with reference to the following description and drawings, wherein.

DISCLOSURE OF INVENTION

Figure 1:
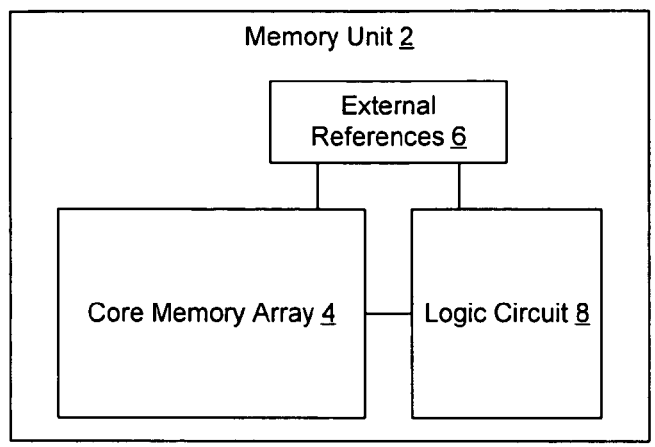
FIG. 1 is a schematic block diagram of an exemplary memory unit having a plurality of core memory devices to which a method of programming in accordance with the present invention can be applied.

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

Aspects of the present invention relate to a method of programming a non-volatile, flash electrically erasable and programmable memory device. More specifically, the method relates to programming a memory device while apply a bias voltage to a source of the memory device. The source side bias potential is coupled to the source using a gate (e.g., pass transistor) driven at a voltage higher than the available operating voltage (Vcc). For instance, the gate can be driven with a voltage that is at least three times higher than the available operating voltage. In one embodiment, the gate is driven with a drain pump voltage. In another embodiment, the gate is driven with a programming voltage applied to the gate of the memory device to be programmed.

The techniques described herein are applicable to a variety of flash memory devices, including NOR architecture memory devices such as floating gate memory devices and dielectric charge storing devices having two or more charge storing regions per device. It should be recognized that other types of memory devices, such as NAND architecture memory devices, also can be programmed using the techniques described herein. Nevertheless, the present invention will be described in the exemplary context of programming a floating gate memory device.

With reference to FIG. 1, shown is a schematic block diagram of an exemplary memory unit 2. The memory unit 2 can include a core memory array 4 containing a plurality of memory devices that include, for example, core memory devices for storing data, and dynamic reference memory devices for tracking data level behavior of the core memory devices over time. Other memory devices, such as external references 6, can also form a part of the memory unit 2. The external reference 6 are separate from the core memory array 4 and can include, for example, erase verify reference cells, program verify reference cells and soft programming reference cells. Various operations of the memory unit 2, including, for example, programming, verifying, reading and erasing, can be controlled by a logic circuit 8. As one skilled in the art will appreciate, the memory unit 2 can be used by a customer of the memory unit 2 to store information, such as data or executable code.

Figure 2:
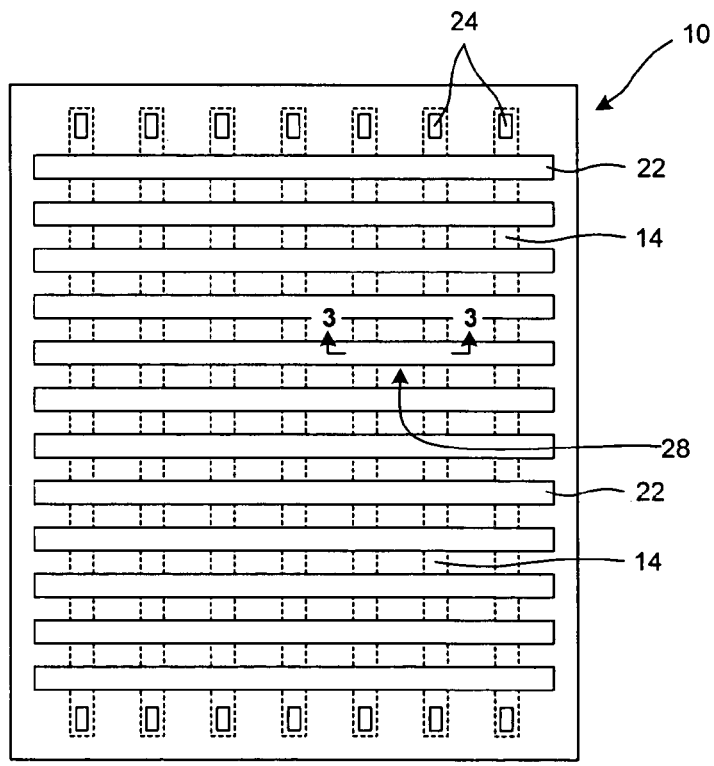
FIG. 2 is a schematic block diagram of an example core memory array sector from the memory unit.

With additional reference to FIG. 2, shown is a top view, schematic block diagram of an exemplary core memory array sector 10. It should be understood that the core memory array sector 10 can be sized as desired. The memory array 4 of the memory unit 2 can include multiple sectors 10.

Figure 3:
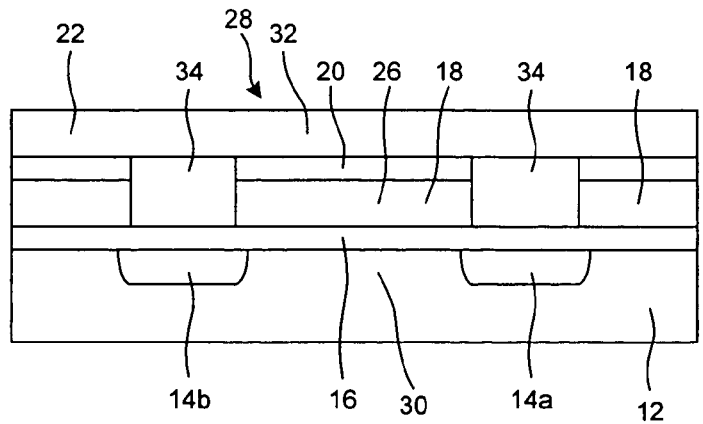
FIG. 3 is a schematic cross-section illustration of an exemplary core memory device from the core memory array taken along the line 3—3 of FIG. 2.

With additional reference to FIG. 3, the memory array 10 can include a semiconductor substrate 12 having a plurality of bitlines 14 (also referred to herein as conductive regions) formed in buried bitline format. Above the bitlines 14 is formed a lower dielectric layer, or tunnel dielectric layer 16, a charge storing layer 18, and a top dielectric layer 20. A plurality of wordlines 22 can be formed over the top dielectric layer 20. Bitline contacts 24 can be used to establish electrical connection to the bitlines 14.

In the illustrated embodiment, the charge storing layer 18 is conductive (e.g., made from doped-polysilicon) and forms a floating gate 26 in the area between adjacent bitlines 14 and under the wordlines 22 to operatively form a "floating gate" memory device (or cell) 28. For each device 28, adjacent pairs of bitlines 14 form conductive regions that function respectively as a source and a drain during various programming, verifying, reading and erasing operations. Interposed between each pair of bitlines 14, the substrate 12 forms a channel region 30 operatively controlled by the application of voltage to the corresponding wordline 22 that functions as a gate electrode. Therefore, the wordline 22 can be considered to define a control gate 32. In alternative arrangements, control gates are formed from individual conductive islands or pads that are interconnected by the wordlines 22. An interdielectric layer 34 may be present between the floating gates 26 to isolate the floating gates 26 from one another.

In another embodiment, the charge storing layer 18 is non-conductive (e.g., made from a dielectric material such as silicon nitride). This arrangement results in the formation of dielectric charge storing devices, or dual cell memory device, and includes a pair of complimentary charge trapping regions that can be independently programmed and read. Such a configuration allows for the storing of a first unit of charge (e.g., a normal bit) adjacent one of the bitlines 14 and a second unit of charge (e.g., a complementary bit) adjacent the other of the bitlines 14. In this embodiment, the charge storing layer 18 may continuously overlie the substrate in the area of the array 10.

In both embodiments, the application of appropriate voltages to the wordlines 22 and the bitlines 14 allows for the addressing of the memory devices 28 of the sector such that each memory device 28 can be programmed, read, verified and/or erased. For simplicity of the discussion herein, only the operation of one core memory device 28 will be described. However, the remaining memory devices 28 can have a corresponding structure and operation.

As one skilled in the art will appreciate, the illustrated memory device 28 is exemplary and modifications to the memory device 28 can be made. Such modifications can include changes to the physical arrangement of the core memory device 28 (e.g., type of memory device), materials used, doping parameters and the like. However, the programming, verifying, reading and/or erasing techniques described herein can be used in conjunction with such a modified device.

For purposes of the present disclosure, the programming technique to store charge in the floating gate 26 involves hot electron injection, also referred to as channel hot electron injection (CHE). However, it should be appreciated that modifications to the programming techniques can be made to accommodate variations in the specific memory device used.

Using hot electron injection, the floating gate 26 can be programmed to store electrons by applying voltages to one of the bitlines 14 (e.g., bitline 14a functioning as the drain) and to the wordline 22 (e.g., functioning as the control gate 32). The other bitline 14 (e.g., bitline 14b functioning as the source) provides carriers (e.g., electrons) for the CHE programming of the memory device 28. In one embodiment, a bias voltage potential is applied to the source. Application of the source bias potential will be described in greater detail below. As a result of the application of a bias potential to the source during programming, greater control over electron injection can be accomplished, which leads to enhanced data retention capability of the memory device 28. For instance, the source bias potential can function to limit programming current of the programmed cell and reduce bitline leakage from unprogrammed cells on the same bitline.

The voltages applied to the control gate 32, the source and the drain of the programmed cell generate a vertical electric field through the dielectric layers 16 and 20 and the charge storing floating gate 26 and a lateral electric field along the length of the channel 30 from the source to the drain. At a given threshold voltage, the channel 30 will invert such that electrons are drawn off the source and begin accelerating toward the drain. As the electrons move along the length of the channel 30, the electrons gain energy and upon attaining enough energy, the electrons are able to jump over the potential barrier of the bottom dielectric layer 16 and into the floating gate 26 where the electrons become trapped. These accelerated electrons are termed hot electrons and once injected into the floating gate 26, stay in the floating gate 26.

Verifying the programmed state of the memory device 28 and reading of the memory device 28 can be carried out in similar manners. For example, to read the memory device 28, a voltage can be applied to one of the bitlines 14 which is also referred to as the drain during verify and read operations and a voltage can be applied to the control gate 32. The other bitline 14, which is also referred to as the source during verify and read operations, can be grounded. During these operations, an amount of current drawn across the channel 30 can be used as an indication of memory device 28 threshold voltage and can be compared against a reference current(s) (as indications of reference threshold voltages) to determine the data state of the "read" memory device 28.

Figure 4:
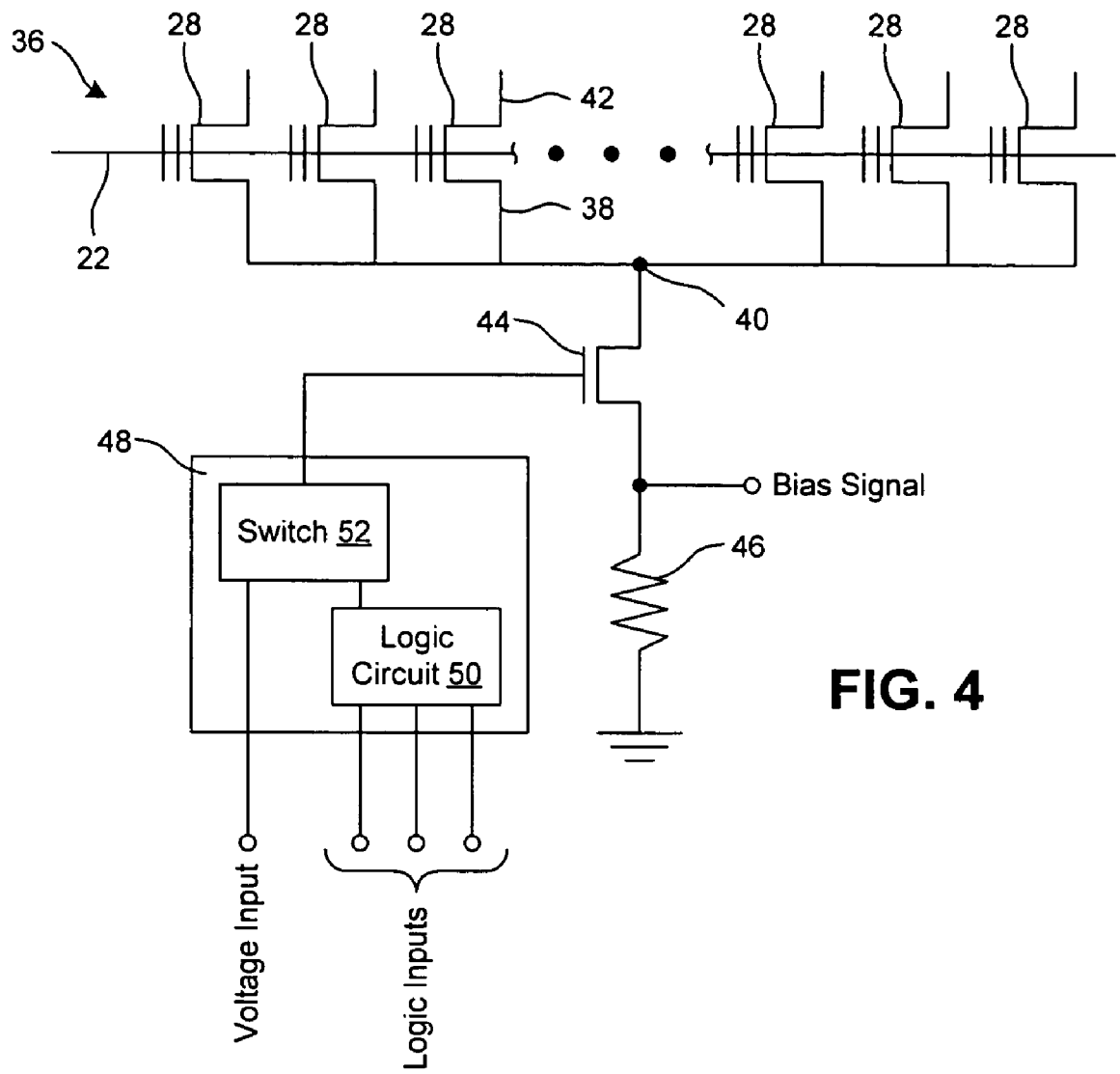
FIG. 4 is a schematic diagram of a row of memory devices to be programmed using a source side bias in accordance with the present invention.

With additional reference to FIG. 4, shown is a schematic diagram of a row 36 of memory devices 28 to be programmed using a source side bias. A source 38 (implemented with respective bitlines 14) of each device 28 can be operatively coupled to form a sector source node 40. During programming of a specific device 28, a drain 42 (implemented with a respective bitline 14) of the programmed device 28 can be coupled to a programming drain voltage (sometimes referred to as a drain pump voltage) and the wordline 22 can be coupled to a programming gate voltage (sometimes referred to as a gate pump voltage). In one embodiment, the drain pump voltage is about 5.5 volts and the programming gate voltage is about 9.3 volts.

During programming, the sector source node 40 can be coupled to a global source side bias potential, or bias signal, through a pass transistor 44. For example, the sector source node 40 can be connected to a source of the pass transistor 44 and the bias signal can be applied to the drain of the pass transistor 44. A fixed resistor 46 can be connected between the drain of the pass transistor 44 and ground. The fixed resistor functions as a source-voltage-source during programming and limits leakage current, thereby enhancing programming efficiency. In one embodiment, the bias signal is about 0.8 volts.

As should be appreciated, if the pass transistor 44 is not turned on or not fully turned on during programming, the potential at the sector source node 40 can rise, leading to a degradation in the program operation of the memory devices 28. For instance, in low power applications (e.g., plus Vcc of about 1.8 volts and minus Vcc of about 1.6 volts), the operational voltage available to the memory unit 2 from an external power source can be small relative to the bias signal (e.g., a back bias on the source of the pass transistor 44 of about 0.8 volts to about 1.0 volts). In this situation, use of the operational voltage to gate the pass transistor 44 will likely result in a failure to fully turn on the pass transistor 44.

Therefore, the pass transistor 44 is turned on using a voltage (referred to herein as a pass transistor gate voltage) that is large relative to the bias signal. In one embodiment, the pass transistor gate voltage is at least three times the available operational voltage supplied to the memory unit from an external power supply. In another embodiment, the drain pump voltage is coupled to be used as the pass transistor gate voltage. In yet another embodiment, the programming gate voltage is coupled to be used as the pass transistor gate voltage. Using a drain pump voltage of about 5.5 volts, a programming gate voltage of about 9.3 volts and an operational voltage of 1.8 volts, the pass transistor gate voltage can be, in one embodiment, about three to about five times the operational voltage.

A pass transistor control circuit 48 can be used to turn the pass transistor 44 on and off by the selective application of the pass transistor gate voltage to the gate of the pass transistor 44. For example, the control circuit 48 can receive logic signals from the logic circuit 8 (FIG. 1) at logic inputs. These logic signals can control a logic circuit 50 of the control circuit 48 to gate a switch 52 that applies a voltage received at a voltage input to the control circuit 48 to the gate of the pass transistor 44 as the pass transistor gate voltage. In the embodiment where the pass transistor gate voltage is the drain pump voltage, the drain pump voltage is applied to the voltage input of the control circuit 48. In the embodiment where the pass transistor gate voltage is the programming gate voltage, the programming gate voltage is applied to the voltage input of the control circuit 48. The switch 52 can be implemented with a pass transistor, where a gate is controlled by the logic circuit 50, a drain is connected to the voltage input and a source is connected to the gate of the pass transistor 44. It should be appreciated that the control circuit 48 can be embodied as part of the logic circuit 8.

In the embodiments where either the drain pump voltage or the programming gate voltage is used as the pass transistor gate voltage, programming voltages are employed in logic operations of the memory unit 2. In the illustrated example, the desired programming voltage are applied as an input to the control circuit 48 that selectively applies the programming voltage as a control signal to the pass transistor 44. The result is the use of the programming voltage as a control signal in addition to a voltage to effectuate CHE programming of the memory devices 28.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of programming a flash memory device from a memory unit, comprising:
   applying a programming gate voltage to a control gate of the memory device;
   applying a programming drain voltage to a drain of the memory device; and
   coupling a source bias potential to a source of the memory device with a pass transistor controlled with a control signal having a voltage greater than an operational voltage available to the memory unit from an external power source and the control signal being the selective application of one of the programming drain voltage or the programming gate voltage to a gate of the pass transistor, wherein the voltage of the control signal is at least three times the operational voltage available to the memory unit from the external power source.

2. The method according to claim 1, wherein coupling the source bias potential to the source of the memory device includes coupling the source bias potential to a common source junction node of a sector of the memory device.

3. The method according to claim 1, wherein the pass transistor couples a source-voltage-source resistor to the source of the memory device.

4. The method according to claim 1, wherein the control signal is selectively applied to the pass transistor using a logic circuit.

5. The method according to claim 1, wherein the memory device is selected from a floating gate memory device and a charge trapping dielectric memory device.

6. A flash memory unit having a plurality of flash memory devices arranged in a sector, comprising:
a plurality of wordlines arranged with respect to a plurality of bitlines and a charge storing layer to operatively form the memory devices;
a pass transistor selectively operable in response to a control signal to couple a source bias voltage to a common source junction node defined by bitlines connected to function as source conductive regions for the memory devices during programming; and
a control circuit for selectively applying one of a programming gate voltage or a programming drain voltage to a gate of the pass transistor as the control signal, wherein the control signal has a potential of at least three times an operational voltage available to the memory unit from an external power source.

7. The memory unit according to claim 6, wherein the charge storing layer is conductive and the memory devices are configured as floating gate memory devices.

8. The memory unit according to claim 6, wherein the charge storing layer is non-conductive and the memory devices are configured as dielectric charge storing devices, each with plural charge storing regions.

9. The memory unit according to claim 6, further comprising a source-voltage-source resistor connected to a source bias input node of the pass transistor.

* * * * *